US012763099B1

(12) United States Patent
Basak et al.

(10) Patent No.: US 12,763,099 B1
(45) Date of Patent: Oct. 13, 2026

(54) SINGLE MODE LASER DIODE HAVING MULTILAYER DIELECTRIC MIRROR PROVIDING IN-PHASE BACK FACET REFLECTION

(71) Applicant: Seagate Technology LLC, Fremont, CA (US)

(72) Inventors: Supratim Basak, Londonderry (GB); Danmark Ramos Pablo, Londonderry (GB); Aidan Dominic Goggin, Redcastle (IE)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 19/326,255

(22) Filed: Sep. 11, 2025

(51) Int. Cl.
*G11B 5/48* (2006.01)
*G11B 7/127* (2012.01)
*H01S 5/028* (2006.01)
*G11B 5/00* (2006.01)

(52) U.S. Cl.
CPC ............ *G11B 5/4866* (2013.01); *G11B 7/127* (2013.01); *H01S 5/0287* (2013.01); *G11B 2005/0021* (2013.01)

(58) Field of Classification Search
None
See application file for complete search history.

(56) References Cited

U.S. PATENT DOCUMENTS 5,231,642 A * 7/1993 Scifres .................... H01S 5/423 372/50.11
5,355,385 A * 10/1994 Amano .................. H10H 20/84 372/49.01
2006/0157723 A1* 7/2006 Lambkin .............. H10H 20/853 257/98
2008/0273563 A1* 11/2008 Schmidt .................... H01S 5/16 372/45.01
2009/0086769 A1* 4/2009 Minamio ............... B82Y 20/00 372/5

(Continued)

OTHER PUBLICATIONS

Jeong et al., "Measurement of Facet Reflectivity Through Reflection Gain in Fabry-Pérot Laser Diode" Jul. 15, 2008, *IEEE Photonics Technology Letters*, 20(4):1225-1227.

*Primary Examiner* — Peter Vincent Agustin
(74) *Attorney, Agent, or Firm* — Mueting Raasch Group

(57) ABSTRACT

Described are laser diodes, and hard drive devices incorporating laser diodes, that include multilayer dielectric mirrors on the back facets thereof that are constructed to provide a high degree of in-phase reflectivity. Such laser diode constructions can help ensure stable single-mode laser operation, which may be useful in maintaining or increasing high areal density capability recording in heat-assisted magnetic recording applications. The described laser diodes include an encapsulant layer over at least the front and back facet, and a multilayer dielectric mirror disposed over the encapsulant layer at the back facet. The multilayer dielectric mirror includes alternating layers of high and low refractive index material, the high refractive index being higher than that of the encapsulant layer and the low refractive index being lower than that of the encapsulant layer. A layer of the low refractive index material is disposed immediately adjacent to the encapsulant layer. This construction can produce high reflectivity as well as in-phase reflections.

20 Claims, 4 Drawing Sheets

(56) References Cited

U.S. PATENT DOCUMENTS

| | | | | |
|---|---|---|---|---|
| 2009/0129417 | A1* | 5/2009 | Maeda | H01S 5/18355 438/46 |
| 2010/0046564 | A1* | 2/2010 | Minamio | G11B 7/127 372/43.01 |
| 2010/0111125 | A1* | 5/2010 | Kondo | H01S 5/1833 372/45.01 |
| 2010/0226402 | A1* | 9/2010 | Maeda | B82Y 20/00 372/45.01 |
| 2012/0044967 | A1* | 2/2012 | Cole | G11B 5/105 372/92 |
| 2013/0223462 | A1* | 8/2013 | Olson | H01S 5/2202 438/42 |
| 2015/0295384 | A1* | 10/2015 | Tatah | G02B 6/4208 369/13.33 |
| 2018/0261979 | A1* | 9/2018 | Gerlach | H01S 5/18308 |
| 2021/0367409 | A1* | 11/2021 | Castiglia | H01S 5/22 |
| 2022/0102943 | A1 | 3/2022 | Chen et al. | |

* cited by examiner

SINGLE MODE LASER DIODE HAVING MULTILAYER DIELECTRIC MIRROR PROVIDING IN-PHASE BACK FACET REFLECTION

TECHNICAL FIELD

The disclosure relates to single mode laser diode constructions, and particularly to single mode laser diodes useful for heat-assisted magnetic recording.

SUMMARY

In accordance with certain aspects, the present disclosure describes faceted laser diodes, for example for incorporation into heat-assisted magnetic recording hard disk drives. Such laser diodes include an encapsulation layer covering at least a front facet and a back facet, and a multilayer dielectric mirror disposed over the encapsulation layer at the back facet, where the multilayer dielectric mirror includes alternating layers of a high refractive index material and a low refractive index material to thereby form multiple high/low index layer pairs, and in which one of the low refractive index material layers is immediately adjacent to the encapsulation layer. The low refractive index material has a refractive index lower than that of the encapsulation layer, and the high refractive index material has a refractive index higher than that of the encapsulation layer.

In certain aspects, the encapsulation layer may be composed of a SiN material, the low refractive index material may be composed of a $SiO_x$ material, and/or the high refractive index material may be composed of a $TiO_x$ material or a $NbO_x$ material. In certain aspects, the laser diode may be a GaAs-based laser diode.

In certain aspects, the multilayer dielectric mirror has at least three high/low layer pairs.

In certain aspects, the refractive indices and thicknesses of the encapsulation layer and the layers of the multilayer dielectric mirror are selected to produce in-phase reflections. For example, for a laser diode that emits light at a given wavelength, the encapsulation layer may have a thickness at the back facet of about one half the wavelength in the encapsulation layer, and each layer of high refractive index material and the low refractive index material has a thickness that is about quarter the wavelength in the respective material.

In accordance with certain aspects, the present disclosure describes hard disk drive devices that incorporate the described laser diodes.

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

Figure 1:
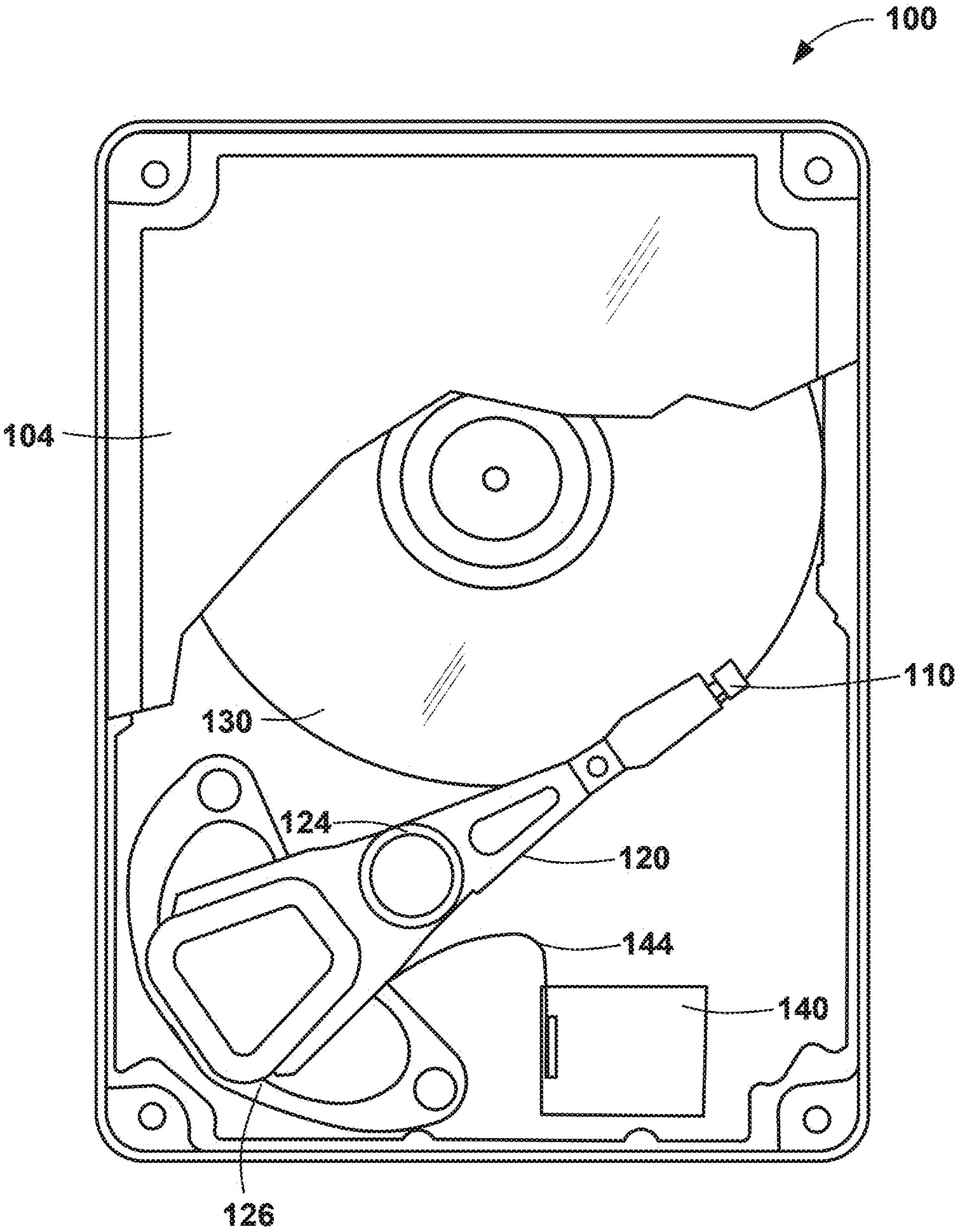
FIG. 1 is a schematic perspective view of heat-assisted magnetic recording hard disk drive that may incorporate laser diode constructions in accordance with aspects of the present disclosure.

The present disclosure relates to the construction of laser diodes useful in heat-assisted magnetic recording (HAMR) applications, and in particular to the construction of dielectric mirrors for faceted laser diodes. In HAMR, electromagnetic radiation emitted by a laser diode is used to excite plasmonic activity in a near field transducer (NFT), which may be focused onto the surface of magnetic recording media to generate heat to assist in the writing of bits on the media. Single mode laser diodes provide for stable laser operation and reduced low frequency noise, which can allow for the storing of data at high areal density capability (ADC). Faceted laser diodes having multilayer dielectric mirrors constructed in accordance with aspects of the present disclosure can help maintain single mode operation.

A faceted single mode laser diode is a type of laser diode that utilizes a specific design to achieve single mode operation. The design involves the use of a laser resonator cavity with two mirrors, one mirror located at the front facet of the laser diode and the other mirror located at the back (rear) facet of the laser diode. Photons having a frequency of the resonant mode travel in the cavity, reflecting back and forth between the two facets, and being amplified by the semiconductor gain medium inside the cavity. The laser beam is ultimately emitted from an antireflective coated edge of the laser diode. It has been observed that multi-mode behavior on Fabry-Perot laser designs having mirror structures at both ends of the cavity can be caused by high mirror loss and out-of-phase reflections. As such, the present disclosure provides a multilayer dielectric mirror at the back facet of the laser diode to reduce mirror losses by providing a high level of reflection as well as reflections that are phase matched.

Laser constructions of the present disclosure include a silicon nitride (SiN) layer that encapsulates the laser, including at the front and back facets. The presence of the SiN encapsulation layer is dictated by the front mirror design. In accordance with the present disclosure, it has been determined that a multilayer dielectric mirror can be provided at the back facet of a faceted laser diode in a manner that accommodates the presence of the SiN encapsulation layer to thereby produce a high level of phase matched reflection. In particular, the multilayer dielectric mirror may be constructed from alternating layers of high and low refractive index materials, the high index being higher than the refractive index of SiN, and the low index being lower than the refractive index of SiN. The multilayer dielectric mirror is constructed so that the layer immediately adjacent to the SiN encapsulant is the low index layer, and the layer thicknesses of the SiN encapsulant and of the multilayer dielectric mirror are selected to produce phase matched reflections.

In current GaAs-based laser diode designs used for HAMR applications, the back facet mirror is typically composed of gold (Au), which can produce an antiphase reflection condition due to a wave pattern mismatch between the light reflected at the GaAs/$Si_3N_4$ interface and the light reflected at the $Si_3N_4$/Au interface inside the cavity. As recognized in the present disclosure, replacing the Au mirror with a multilayer dielectric mirror having alternating low and high index layers allows the reflectivity to remain high while also providing for phase matched reflections. In particular, it has been observed that by constructing the multilayer dielectric mirror on the SiN layer with the low index layer being immediately adjacent to the SiN layer, phase matched reflections can be produced. Such in-phase reflections achieve stable single mode operation of the laser diode. For the purposes of the present disclosure, in-phase reflections refer to reflections of light back into a laser cavity such that the phase of the reflected light does not lead to significant destructively interference with light traversing the cavity. Such reflections may be from interfaces such as GaAs/$Si_3N_4$, $Si_3N_4$/$SiO_2$ and $SiO_2$/$TiO_2$.

Reference will now be made to the drawings, which depict one or more aspects described in this disclosure. However, it will be understood that other aspects not depicted in the drawings fall within the scope of this disclosure. Like numbers used in the figures refer to like components, steps, and the like. However, it will be understood that the use of a reference character to refer to an element in a given figure is not intended to limit the element in another figure labeled with the same reference character. In addition, the use of different reference characters to refer to elements in different figures is not intended to indicate that the differently referenced elements cannot be the same or similar. It will also be appreciated that the drawings are meant to illustrate certain aspects and arrangements of features in a way that contributes to their understanding and are not meant to be scale drawings that accurately represent size or shape of elements.

FIG. 1 schematically depicts an example HDD device 100 that includes a recording head 110 having read and write capabilities. Recording head 110 is disposed on the end of an actuator arm 120 that is rotationally movable around a pivot 124 by use of a voice coil motor 126. Other driving and actuation mechanisms may be used, including piezoelectric motors, linear rail actuators, and so forth. The recording head 110, which may include a write transducer (writer) and a read transducer (reader), is positioned in close proximity to the surface of magnetic media disk 130 such that the recording head can write data to and read data from tracks on the magnetic media 130 as it spins by action of a spindle motor (not indicate). Controller electronics 140 may be coupled to the voice coil motor 126 and recording head 110 via a flex cable 144 that connects to traces on the actuator 120. Preamp electronics (not indicated) are typically disposed close to the recording head 110 for conditioning signals to and from the recording head. Controller electronics 140 may also be communicatively coupled to spindle motor, and thereby control the spinning of the media disk(s) 130 along with the movement of the actuator 120 and the reading and writing of data via recording head 110.

The internal components of HDD 100 are contained within an enclosure that includes a cover 104 that is shown partially cut away to reveal the internal components. The enclosure may be sealed and filled with a desired atmosphere, such as a gas mixture including primarily helium gas, to create a controlled environment inside the HDD 100. A host device can communicate with HDD 100 through a standardized interface (not shown). HDD 100 can operate on any magnetic recording principle, whether that be conventional magnetic recording (CMR), shingled magnetic recording (SMR), HAMR, or any other type of recording technique, including combinations thereof. Recording head 110 may incorporate components for heat-assisted magnetic recording, such as a single mode laser diode in accordance with one or more aspects of the present disclosure.

Figure 2:
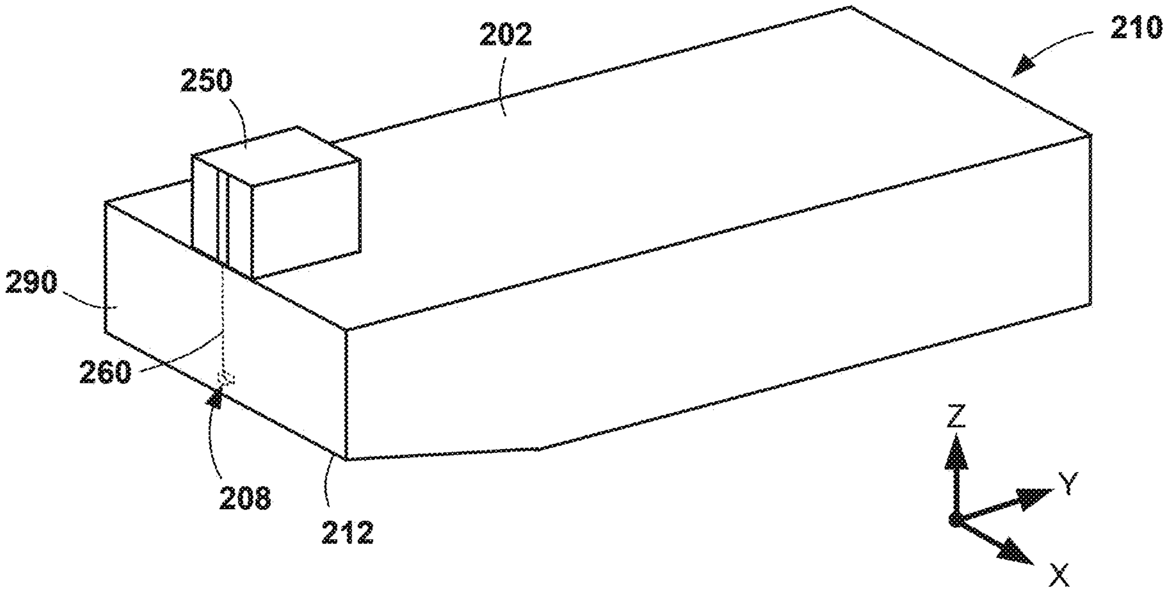
FIG. 2 is a schematic perspective view of a heat-assisted magnetic recording head that may incorporate a laser diode in accordance with aspects of the present disclosure.

In reference to FIG. 2, a perspective view shows a recording head 210 according to an example embodiment. The recording head 210 may be used in a magnetic data storage device such as a HAMR hard disk drive. The recording head 210 has a slider body 202 with read and write transducers 208 at a trailing edge 290 that are held proximate to a surface of a magnetic recording medium (not shown), such as a spinning magnetic disk. The illustrated recording head 210 is configured for a HAMR device, and so it includes components that form a hot spot on the recording medium near the read and write transducers 208. These HAMR components include an energy source 250 such as a single mode laser diode, and a waveguide 260. The waveguide 260 delivers electromagnetic energy from the energy source 250 to a near field transducer (NFT) that is part of the read/write transducers 208. The NFT achieves surface plasmon resonance and directs the energy out of a media-facing surface 212 to create a small hot spot in the recording medium.

Figure 3:
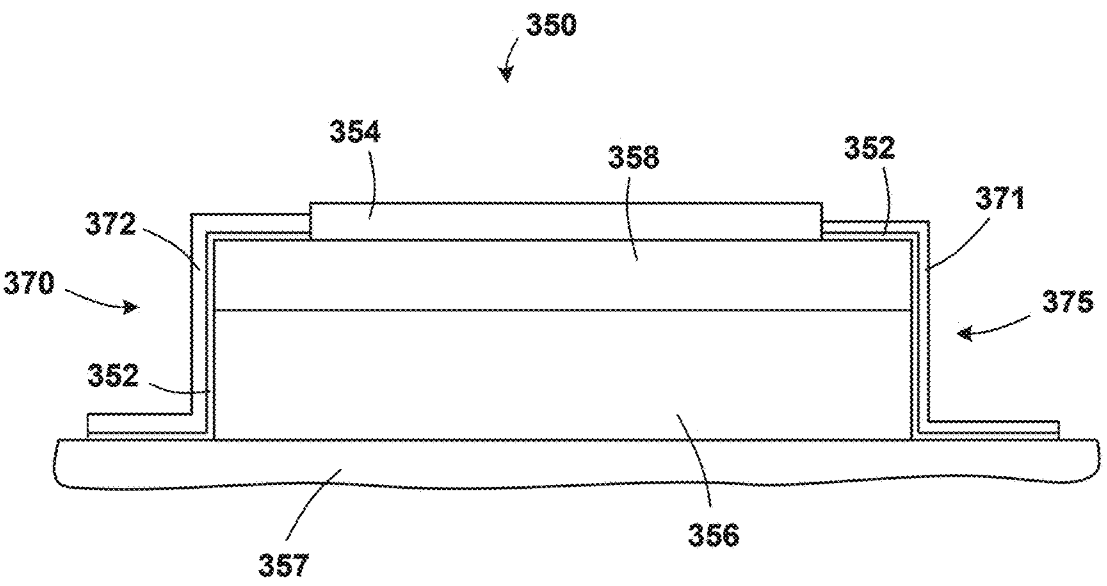
FIG. 3 is a schematic view of a faceted laser diode that may be constructed in accordance with aspects of the present disclosure.

FIG. 3 is a schematic longitudinal view of a faceted laser diode 350 that includes a front facet 375 and a back facet 370. The laser diode 350 may have any suitable construction, and may be composed of any suitable materials. For the sake of illustration, and as a non-limiting example, laser diode 350 is shown to include a top cladding layer 356, such as a p-doped GaAs or AlGaAs material, disposed on a bottom cladding layer 357, such as an n-doped GaAs or AlGaAs material. A p-type GaAs cap 358 is formed over the top cladding layer. Current may be injected into the laser diode 350 from p-metal electrode 354. The laser diode 350 is encapsulated with an encapsulation layer 352 (also called an isolation layer), such as a silicon nitride (SiN) encapsulation layer, which covers both the front facet 375 and the back facet 370. The front facet 375 includes a partial reflector 371, which may include a $SiO_2$ coating over a SiN encapsulation layer 352. The back facet 370 includes a mirror 372 disposed over the encapsulation layer 352. The laser 350 may be encased in an insulating material (not shown) such as aluminum oxide ($AlO_x$) or may be surrounded by air.

In prior designs, the mirror 372 was composed of a highly reflective metal such as Au. In accordance with the present disclosure, mirror 372 is a multilayer dielectric mirror. While a metallic back facet mirror can achieve high reflectivity with simple fabrication, it has been observed in accordance with the present disclosure that such metal mirrors can produce anti-phase reflections, thereby limiting reflectivity, due to the presence of a SiN encapsulation layer in between the GaAs and the Au metal mirror. The present disclosure proposes the use of alternating layers of low and high refractive index materials to form a multilayer dielectric back facet mirror that achieves high reflection that is in-phase. For example, the high index material may be a titanium oxide ($TiO_x$), niobium oxide ($NbO_x$), or other suitable high index material, and the low index material may be a silicon oxide ($SiO_x$) or other suitable low index material formed on the SiN encapsulation layer. Moreover, it has been observed in accordance with the present disclosure that constructing the multilayer dielectric mirror with the high index layer being adjacent to the SiN encapsulation layer exhibits non-optimum reflectivity and anti-phase reflection at the back facet. As such, multilayer dielectric mirror constructions of the present disclosure include alternating high and low index layers staring with a low index layer being immediately adjacent to the SiN encapsulation layer.

Such a construction provides a high degree of reflectivity (for example, on the order of 90% or greater, depending on the number of high/low layer pairs) as well as in-phase reflections.

Figure 4A:
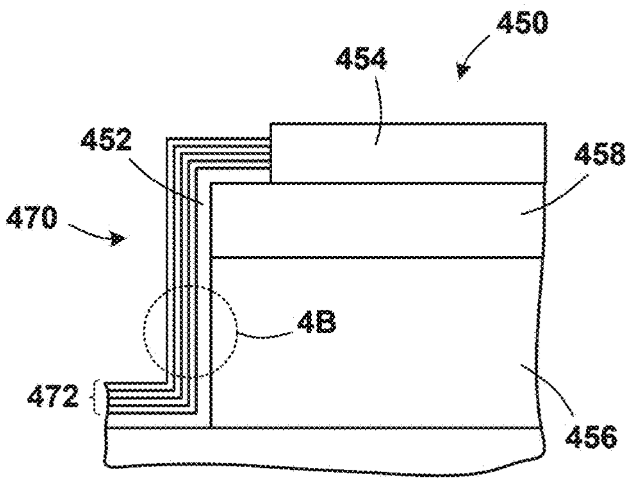
FIG. 4A is a schematic view of a back facet of a laser diode that include a multilayer dielectric mirror in accordance with aspects of the present disclosure.
Figure 4B:
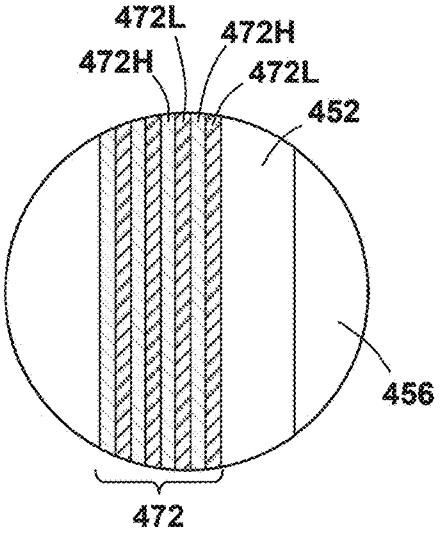
FIG. 4B is a magnified view of the back facet multilayer dielectric mirror shown in FIG. 4A.

FIG. 4A schematically shows the back facet 470 portion of a laser diode 450 that includes a p-metal electrode 454 disposed over a p-type cap 458 on an upper cladding layer 456. The laser diode 450 is encapsulated by a SiN encapsulation layer 452. A multilayer dielectric mirror 472 is disposed over the SiN encapsulation layer 452. The region 4B is magnified and schematically shown in FIG. 4B, which indicates that multilayer dielectric mirror 472 is made up of four layer pairs, each layer pair including a low refractive index layer 472L and an high refractive index layer 472H. The multilayer dielectric mirror 472 is constructed so that the layer immediately adjacent to the SiN encapsulation layer 452 is a low index layer 472L.

In particular embodiments, the SiN encapsulation layer is composed of $Si_3N_4$, which essentially serves as the first layer of the multilayer dielectric mirror stack. The SiN layer can be made optically transparent by using a thickness of about half a wavelength ($\lambda/2$, where $\lambda$ is the wavelength in SiN) of the laser light. For each of the high index and low index layers of the multilayer dielectric mirror, each individual layer preferably has a thickness of about $\lambda/4$ (with $\lambda$ being the wavelength in the material of the given layer). As such, the present disclosure contemplates tuning the thickness and refractive indices of the encapsulation layer and the layers of the multilayer dielectric mirror to thereby control the level of in-phase reflections generated by the reflections therefrom, recognizing that in-phase reflections are desirable for low noise operation of lasers within a HAMR system.

Figure 5:
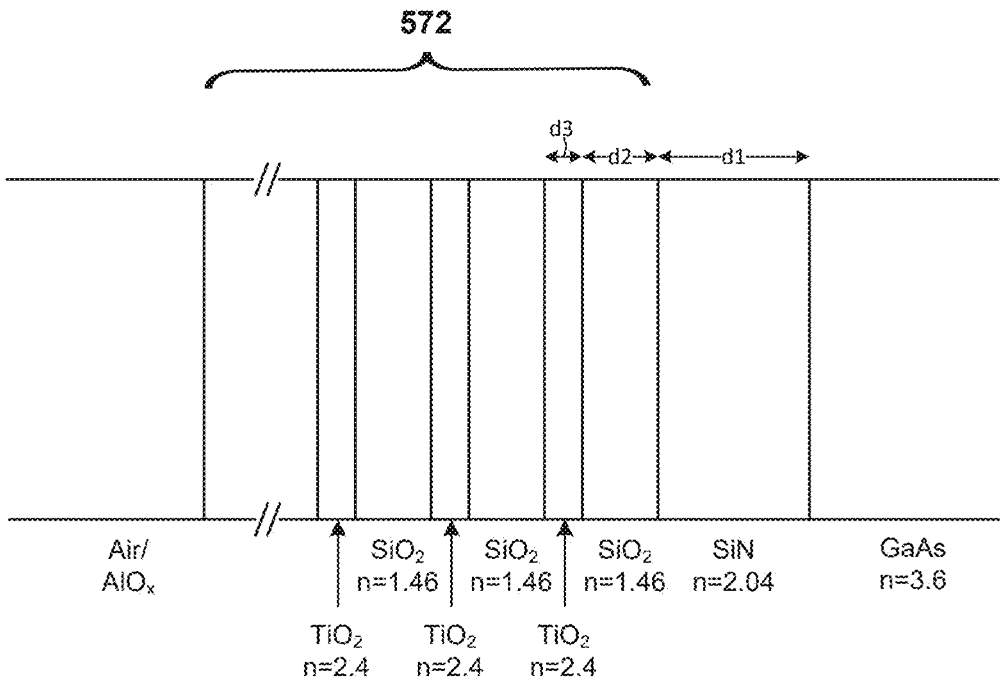
FIG. 5 schematically shows an example construction of a back facet multilayer dielectric mirror in accordance with aspects of the present disclosure.

FIG. 5 schematically illustrates a particular construction of a multilayer dielectric mirror 572 deposited on a SiN layer that encapsulates a GaAs-based laser. The multilayer dielectric mirror 572 includes multiple high/low index layer pairs, typically at least three layer pairs, and may include four layer pairs, five layer pairs, or more. The low refractive index layer has a lower refractive index than that of SiN, which has a refractive index n=2.04. The high refractive index layer has a higher refractive index than that of SiN. In this case, the low refractive index layer is composed of $SiO_2$, which has an index n=1.46, and the high refractive index layer is composed of $TiO_2$, which has an index n=2.4. The thickness d1 of the SiN layer is preferably about one half of a wavelength of the laser light in the SiN material.

For example, for a wavelength of 830 nm, the thickness of the SiN layer may be in a range of about 170 nm to about 230 nm, more preferably about 180 nm to about 220 nm, more preferably about 200 nm to about 210 nm. For the same wavelength of laser light, the thickness d2 of the low index $SiO_2$ layers is about 132 nm to about 152 nm (for example, about 142 nm), which is about one quarter of the wavelength of the laser light in the $SiO_2$ layers. Similarly, the thickness d3 of the high index $TiO_2$ layers is about 76 nm to about 96 nm (for example, about 86 nm), which is about one quarter of the wavelength of the laser light in the $TiO_2$ layers. For a five layer pair construction, such a construction provides a reflectivity of about 91% when the facet is encased in air, and about 89.6% when the facet is encased in $AlO_x$. These may be compared to the reflectivity of a gold mirror on a SiN encapsulated GaAs laser, which is about 83%.

It should be understood that various aspects disclosed herein may be combined in different combinations than the combinations specifically presented in the description and accompanying drawings. It should also be understood that, depending on the example, certain acts or events of any of the processes or methods described herein may be performed in a different sequence, may be added, merged, or left out altogether (for example, all described acts or events may not be necessary to carry out the techniques).

All scientific and technical terms used herein have meanings commonly used in the art unless otherwise specified. The definitions provided herein are to facilitate understanding of certain terms used frequently herein and are not meant to limit the scope of the present disclosure.

As used herein, the term "configured to" may be used interchangeably with the terms "adapted to" or "structured to" unless the content of this disclosure clearly dictates otherwise.

As used herein, the term "or" refers to an inclusive definition, for example, to mean "and/or" unless its context of usage clearly dictates otherwise. The term "and/or" refers to one or all of the listed elements or a combination of at least two of the listed elements.

As used herein, the phrases "at least one of" and "one or more of" followed by a list of elements refers to one or more of any of the elements listed or any combination of one or more of the elements listed.

As used herein, the terms "coupled" or "connected" refer to at least two elements being attached to each other either directly or indirectly. An indirect coupling may include one or more other elements between the at least two elements being attached. Further, in one or more embodiments, one element "on" another element may be directly or indirectly on and may include intermediate components or layers therebetween. Either term may be modified by "operatively" and "operably," which may be used interchangeably, to describe that the coupling or connection is configured to allow the components to interact to carry out described or otherwise known functionality.

As used herein, any term related to position or orientation, such as "proximal," "distal," "end," "outer," "inner," and the like, refers to a relative position and does not limit the absolute orientation of an embodiment unless its context of usage clearly dictates otherwise.

The singular forms "a," "an," and "the" encompass embodiments having plural referents unless its context clearly dictates otherwise.

As used herein, "have," "having," "include," "including," "comprise," "comprising" or the like are used in their open-ended sense, and generally mean "including, but not limited to." It will be understood that "consisting essentially of," "consisting of," and the like are subsumed in "comprising," and the like.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the disclosure.

What is claimed is:

1. A faceted laser diode, comprising:

an encapsulation layer covering the laser diode including a front facet and a back facet; and a multilayer dielectric mirror disposed over the encapsulation layer at the back facet, the multilayer dielectric mirror comprising alternating layers of a high refractive index material and a low refractive index material to thereby form multiple high/low index layer pairs, and in which one of the low refractive index material layers is immediately adjacent to the encapsulation layer, wherein the low refractive index material has a refractive index lower than that of the encapsulation layer, and the high refractive index material has a refractive index higher than that of the encapsulation layer.

2. The laser diode of claim 1, wherein the encapsulation layer is composed of a SiN material.

3. The laser diode of claim 1, wherein the low refractive index material is a $SiO_x$ material.

4. The laser diode of claim 1, wherein the high refractive index material is a $TiO_x$ material or a $NbO_x$ material.

5. The laser diode of claim 1, wherein the laser diode is composed of GaAs.

6. The laser diode of claim 1, wherein the multilayer dielectric mirror has at least three high/low layer pairs.

7. The laser diode of claim 1, wherein the refractive indices and thicknesses of the encapsulation layer and the layers of the multilayer dielectric mirror are selected to produce in-phase reflections.

8. The laser diode of claim 1, wherein the laser diode emits light at a wavelength, and wherein the encapsulation layer has a thickness at the back facet of about one half the wavelength in the encapsulation layer.

9. The laser diode of claim 8, wherein each layer of high refractive index material has a thickness that is about quarter the wavelength in the high refractive index material, and each layer of low refractive index material has a thickness that is about quarter the wavelength in the low refractive index material.

10. The laser diode of claim 9, wherein the wavelength is about 830 nm, the encapsulation layer is composed of a SiN material and has a thickness at the back facet of about 170 nm to about 230 nm, the low refractive index material is $SiO_2$ and each layer of low refractive index material has a thickness of about 132 nm to about 152 nm, and the high refractive index material is $TiO_2$ and each layer of high refractive index material has a thickness of about 76 nm to about 96 nm.

11. The laser diode of claim 10, wherein the SiN material is $Si_3N_4$.

12. The laser diode of claim 1, wherein the encapsulation layer is composed of SiN, and the front facet includes a $SiO_2$ coating over the SiN encapsulation layer.

13. A hard disk drive for heat-assisted magnetic recording, the hard disk drive including a heat-assisted magnetic recording head that includes a laser configured to emit light into a waveguide assisting in magnetic recording, the laser being a faceted laser diode that comprises:

an encapsulation layer covering at least a front facet and a back facet of the faceted laser diode; and a multilayer dielectric mirror disposed over the encapsulation layer at the back facet, the multilayer dielectric mirror comprising alternating layers of a high refractive index material and a low refractive index material to thereby form multiple high/low index layer pairs, and in which one of the low refractive index material layers is immediately adjacent to the encapsulation layer, wherein the low refractive index material has a refractive index lower than that of the encapsulation layer, and the high refractive index material has a refractive index higher than that of the encapsulation layer.

14. The hard disk drive of claim 13, wherein the encapsulation layer is composed of a SiN material, the low refractive index material is a $SiO_x$ material, and the high refractive index material is a $TiO_x$ material or a $NbO_x$ material.

15. The hard disk drive of claim 13, wherein the laser diode is composed of GaAs.

16. The hard disk drive of claim 13, wherein the multilayer dielectric mirror has at least three high/low layer pairs.

17. The hard disk drive of claim 13, wherein the refractive indices and thicknesses of the encapsulation layer and the layers of the multilayer dielectric mirror are selected to produce in-phase reflections.

18. The hard disk drive of claim 13, wherein the laser diode emits light at a wavelength, and wherein the encapsulation layer has a thickness at the back facet of about one half the wavelength in the encapsulation layer, wherein each layer of high refractive index material has a thickness that is about quarter the wavelength in the high refractive index material, and wherein each layer of low refractive index material has a thickness that is about quarter the wavelength in the low refractive index material.

19. The hard disk drive of claim 18, wherein the wavelength is about 830 nm, the encapsulation layer is composed of a SiN material and has a thickness at the back facet of about 170 nm to about 230 nm, the low refractive index material is $SiO_2$ and each layer of low refractive index material has a thickness of about 132 nm to about 152 nm, and the high refractive index material is $TiO_2$ and each layer of high refractive index material has a thickness of about 76 nm to about 96 nm.

20. The hard disk drive of claim 13, wherein the encapsulation layer is composed of SiN, and the front facet includes a $SiO_2$ coating over the SiN encapsulation layer.

* * * * *